(12) United States Patent
Kao et al.

(10) Patent No.: US 7,358,817 B2
(45) Date of Patent: Apr. 15, 2008

(54) LINEARIZED BIAS CIRCUIT WITH ADAPTATION

(75) Inventors: Chi-Hung Kao, Taipei (TW);
Chih-Wei Chen, Taipei (TW);
Cheng-Min Lin, Taipei (TW);
Yun-Shan Chang, Taipei (TW);
Shyh-Chyi Wong, Taipei (TW)

(73) Assignee: RichWave Technology Corp., NeiHu District, Taipei (TW)

( * ) Notice: Subject to any disclaimer, the term of this patent is extended or adjusted under 35 U.S.C. 154(b) by 111 days.

(21) Appl. No.: 11/397,620

(22) Filed: Apr. 5, 2006

(65) Prior Publication Data
US 2006/0226911 A1 Oct. 12, 2006

(30) Foreign Application Priority Data
Apr. 6, 2005 (TW) .............................. 94110905 A

(51) Int. Cl.
*H03F 3/04* (2006.01)
(52) U.S. Cl. .................... 330/296; 330/289; 330/285
(58) Field of Classification Search ................ 330/285, 330/296, 289
See application file for complete search history.

(56) References Cited

U.S. PATENT DOCUMENTS

| 6,333,677 | B1 | 12/2001 | Dening ...................... 330/296 |
| 6,492,874 | B1 * | 12/2002 | Shih .......................... 330/288 |
| 6,744,321 | B2 | 6/2004 | Noh et al. .................. 330/296 |
| 6,842,075 | B2 * | 1/2005 | Johnson et al. ............. 330/296 |
| 7,245,182 | B2 * | 7/2007 | Koizumi ..................... 330/289 |

* cited by examiner

Primary Examiner—Henry Choe
(74) Attorney, Agent, or Firm—Winston Hsu

(57) ABSTRACT

A linearized bias circuit with adaptation resolves the problem happening to the power amplifier with conventional bias circuit that the DC and AC characteristics of the power amplifier shift or even deteriorate due to a temperature variation. The linearized bias circuit with adaptation has a reference voltage source, a first voltage source, a first resistor, a second resistor, a first NPN transistor, a second NPN transistor, and a third NPN transistor. The present invention has the characteristics of bias current temperature compensation, gain and phase compensations to achieve high linearity for the conventional power amplifier and reducing the DC consumption power. At the same time, the quantity of the required elements and layout area in the present invention are small so that the design complexity can be reduced for improving yield, reducing IC layout area, and reducing cost.

14 Claims, 11 Drawing Sheets

LINEARIZED BIAS CIRCUIT WITH ADAPTATION

BACKGROUND OF THE INVENTION

1. Field of the Invention

The present invention is related to a linearized bias circuit with adaptation, and more particularly to an adapted bias circuit design for providing temperature compensation of bias current, linearity improvement, gain, and phase compensation for power amplifier.

2. Description of Related Art

In all kinds of communication systems, for both transmitter and receiver, linearity is a basic and important specification; for transmitter, power amplifier is an important and indispensable element because it determines the communication distance, communication quality and the battery lifetime. Generally, power amplifier always needs DC bias. When power amplifier is biased with conventional bias circuit, linearity of power amplifier may deteriorate with increased input signal power. Furthermore, the DC and AC characteristics of power amplifier using conventional bias circuit may shift obviously, and even deteriorate with temperature variation.

Some conventional linearized bias circuits used in the power amplifier are disclosed in U.S. Pat. No. 6,744,321 (illustrated in FIG. 1) and U.S. Pat. No. 6,333,677 (illustrated in FIG. 2).

SUMMARY OF THE INVENTION

A linearized bias circuit with adaptation includes a reference voltage source, a first voltage source, a first resistor, a second resistor, a first NPN transistor, a second NPN transistor, and a third NPN transistor. First, one end of the first resistor is electrically connected to positive terminal of the reference voltage source and the other end is electrically connected to collector terminal of the first transistor. Collector terminal of the first NPN transistor is also electrically connected to bases of the second transistor and of the third NPN transistor, the base terminal thereof is electrically connected to emitter terminal of the second transistor, and the emitter terminal thereof is electrically connected to one end of the second resistor. The collector terminal of the second NPN transistor is electrically connected to positive terminal of the first voltage source. The collector terminal of the third NPN transistor is electrically connected to the positive terminal of the first voltage source and the emitter terminal thereof is connected to a power amplifier, and the third NPN transistor can provide bias current to the power amplifier. The other end of the second resistor is electrically connected to ground and the second resistor with first and second NPN transistor provides the power amplifier the bias current temperature compensation.

Through the temperature compensation characteristics of the linearized bias circuit with adaptation, the DC and AC characteristics of the power amplifier do not shift or deteriorate due to a temperature variation, and when the input power of the power amplifier is increased to operate in a Class-AB amplification or a Class-B amplification, the linearized bias circuit with adaptation also can provide the compensation for the gain and the phase simultaneously.

BRIEF DESCRIPTION OF THE DRAWINGS

The foregoing aspects and many of the attendant advantages of this invention will be readily appreciated and becomes better understood by reference to the following detailed description, when taken in conjunction with the accompanying drawings, wherein.

DETAILED DESCRIPTION OF PREFERRED EMBODIMENTS

Figure 1:
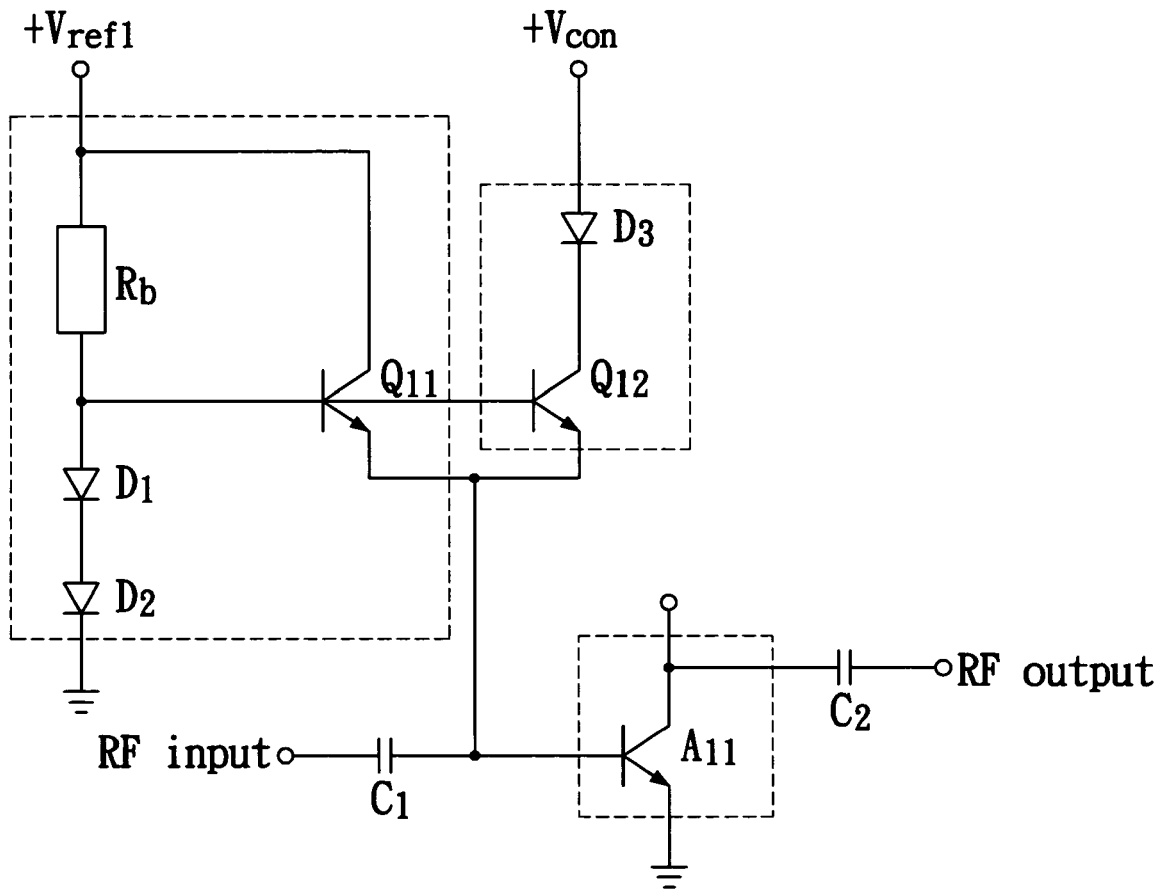
FIG. 1 is a schematic view showing a conventional bias circuit.
Figure 2:
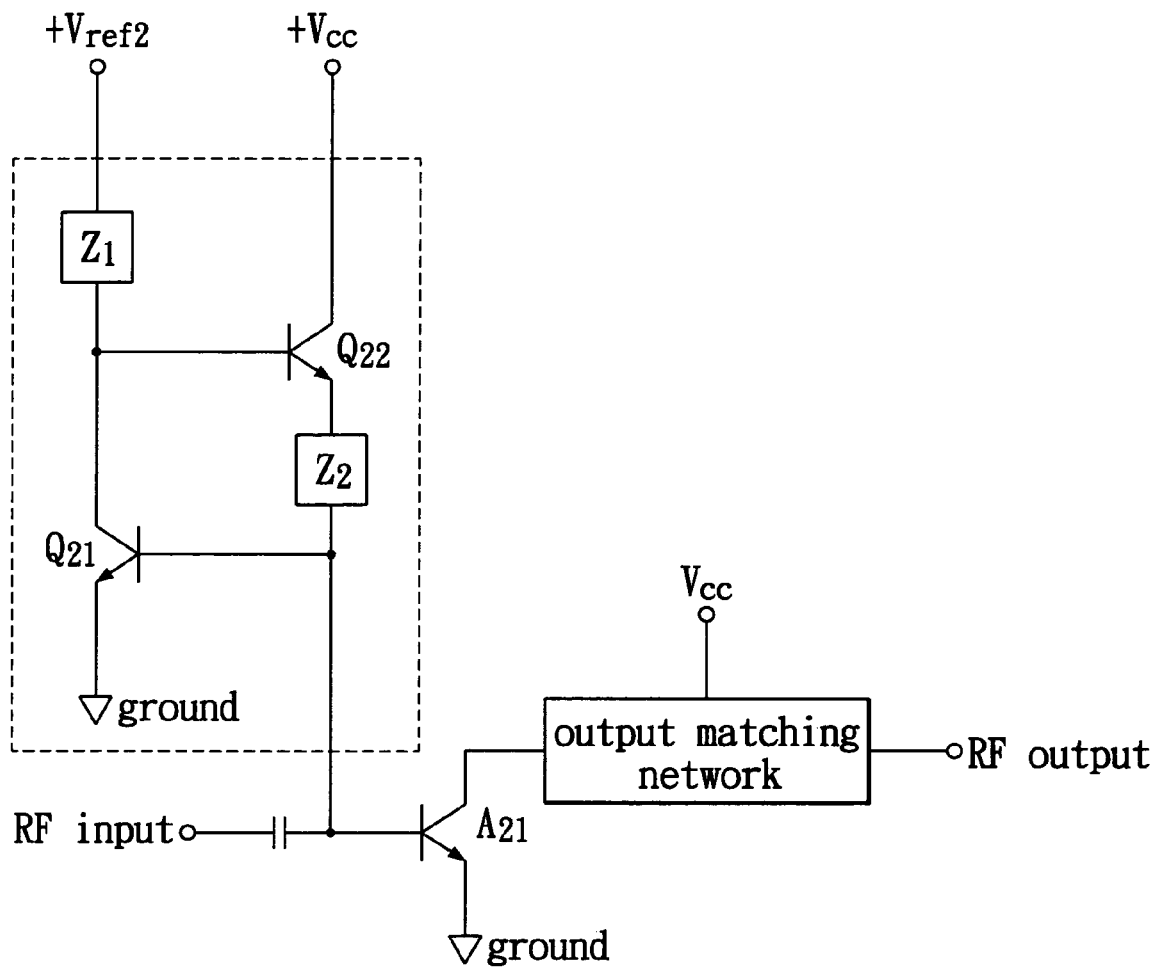
FIG. 2 is a schematic view showing a conventional linearized bias circuit.
Figure 3:
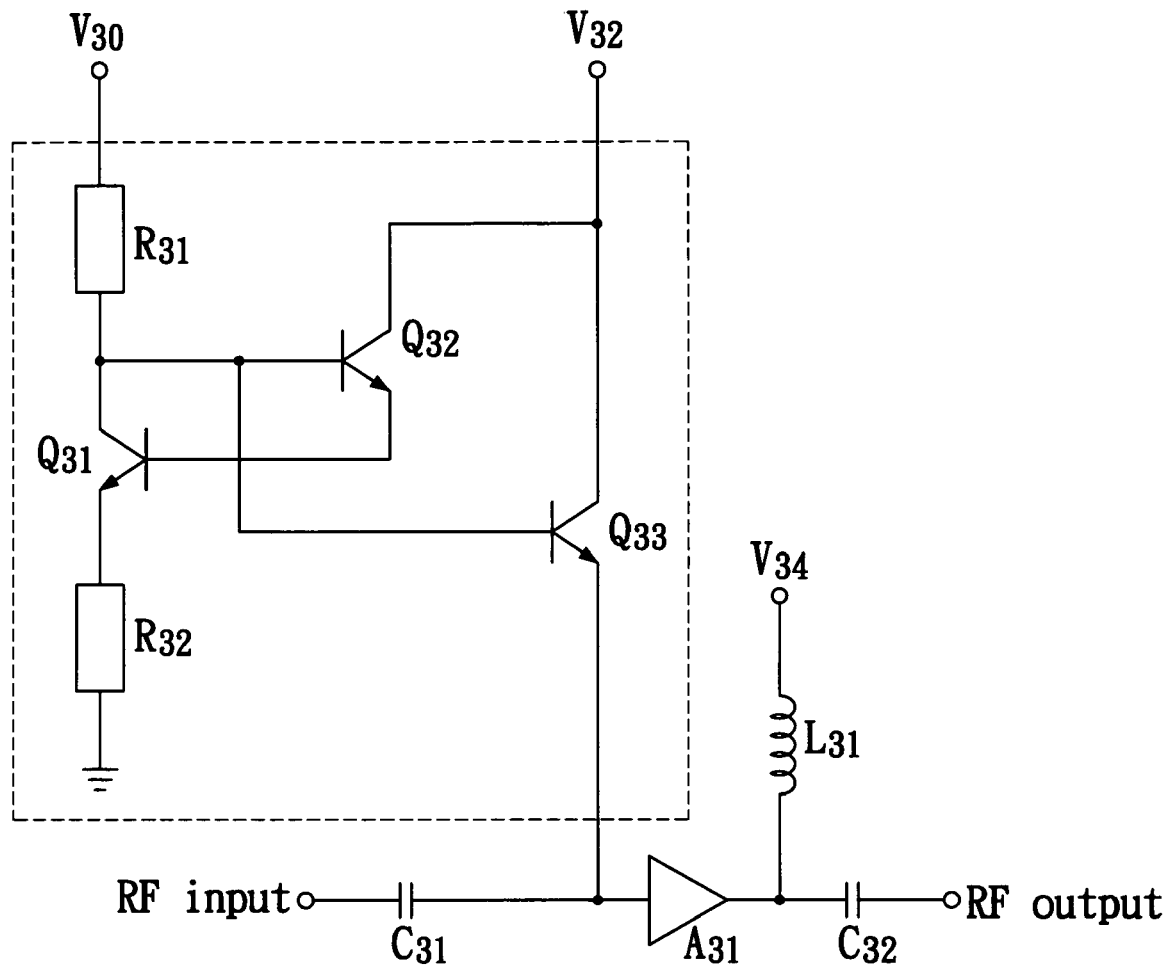
FIG. 3 is a schematic view showing a linearized bias circuit with adaptation in a first embodiment according to the present invention.

Reference is made to FIG. 3, which shows a schematic view of a linearized bias circuit with adaptation in a first embodiment. As shown in FIG. 3, a reference voltage source $V_{30}$, a first voltage source $V_{32}$, a first resistor $R_{31}$, a second resistor $R_{32}$, a first NPN transistor $Q_{31}$, a second NPN transistor $Q_{32}$, and a third NPN transistor $Q_{33}$ are included. First, one end of the first resistor $R_{31}$ is electrically connected to positive terminal of the reference voltage source $V_{30}$ and the other end is electrically connected to collector terminal of the first NPN transistor $Q_{31}$. Additionally, collector terminal of the first NPN transistor $Q_{31}$ is also electrically connected to base terminals of the second and the third NPN transistors $Q_{32}$ and $Q_{33}$, the base terminal thereof is electrically connected to emitter terminal of the second NPN transistor $Q_{32}$, and the emitter terminal thereof is electrically connected to one end of the second resistor $R_{32}$. Moreover, collector terminal of the second NPN transistor $Q_{32}$ is electrically connected to positive terminal of the first voltage source $V_{32}$, collector terminal of the third NPN transistor $Q_{33}$ is also electrically connected to positive terminal of the first voltage source $V_{32}$, and the emitter terminal thereof is electrically connected to power amplifier $A_{31}$ so that the third NPN transistor $Q_{33}$ provides bias current to the power amplifier $A_{31}$. In addition, the other end of the second resistor $R_{32}$ is electrically connected to ground.

Figure 4:
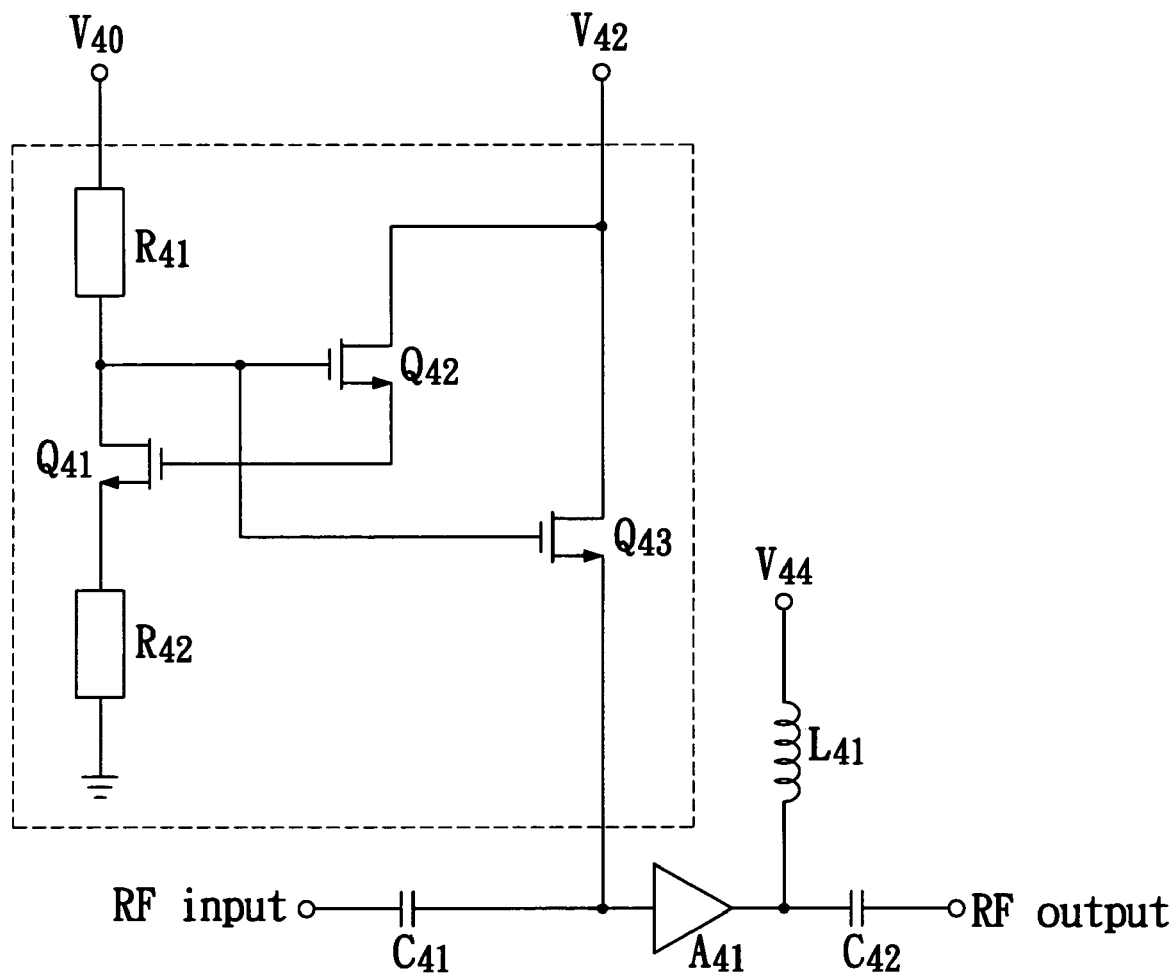
FIG. 4 is a schematic view showing a linearized bias circuit with adaptation in a second embodiment according to the present invention.

Reference is made to FIG. 4, which shows a schematic view of a linearized bias circuit with adaptation in a second embodiment. As shown in FIG. 4, a reference voltage source $V_{40}$, a first voltage source $V_{42}$, a first resistor $R_{41}$, a second resistor $R_{42}$, a first MOS field effect transistor $Q_{41}$, a second MOS field effect transistor $Q_{42}$, and a third MOS field effect transistor $Q_{43}$, are included. Firstly, one end of the first resistor $R_{41}$ is electrically connected to positive terminal of the reference voltage source $V_{40}$ and the other end is electrically connected to drain terminal of the first MOS field effect transistor $Q_{41}$. Additionally, drain terminal of the first MOS field effect transistor $Q_{41}$ is also electrically connected to gate terminals of the second and the third MOS field effect transistors $Q_{42}$ and $Q_{43}$ the gate terminal thereof is electrically connected to source terminal of the second MOS field effect transistor $Q_{42}$, and the source terminal thereof is electrically connected to one end of the second resistor $R_{42}$. Moreover, drain terminal of the second MOS field effect transistor $Q_{42}$ is electrically connected to positive terminal of the first voltage source $V_{42}$, the drain terminal of the third MOS field effect transistor $Q_{43}$ is also electrically connected to the positive terminal of the first voltage source $V_{42}$, and the source terminal thereof is electrically connected to a power amplifier $A_{41}$ so that the third MOS field effect transistor $Q_{43}$ provides bias current to the power amplifier $A_{41}$. In addition, the other end of the second resistor $R_{42}$ is electrically connected to ground.

"Consequently, the linearized bias circuit with adaptation according to the present invention is characterized in that."

Figure 5:
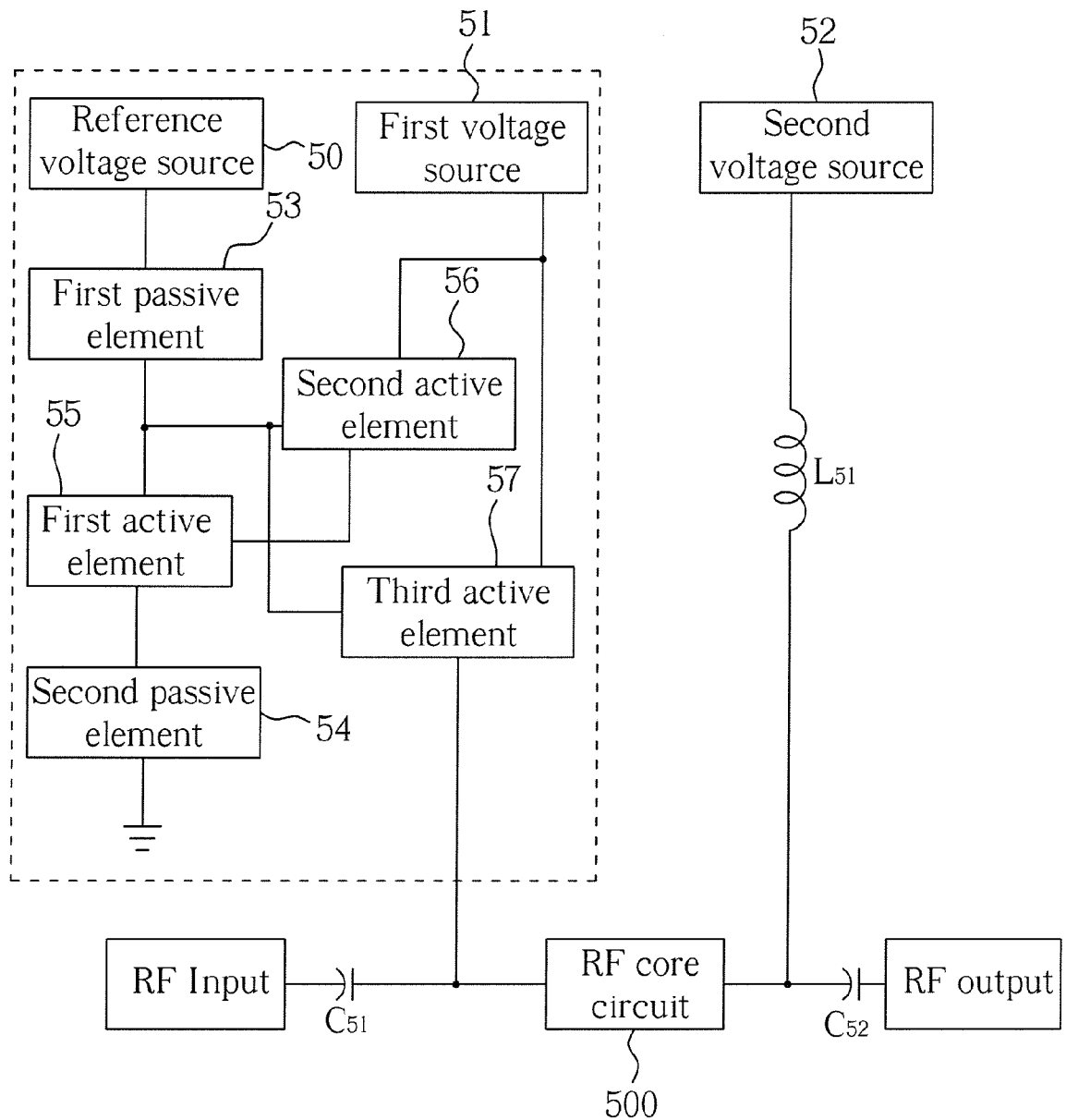
FIG. 5 is a functional block diagram showing a linearized bias circuit with adaptation according to the present invention.

Reference is made to FIG. 5, which shows a functional block diagram showing a linearized bias circuit with adaptation according to the present invention. One end of a first passive element 53 is connected to a reference voltage source 50, while another end is connected to a first active element 55 and a second active element 56. A second passive element 54 is connected between the first active element 55 and ground. The second active element 56 is connected to a first voltage source 51, the first passive element 53, the first active element 55, and a third active element 57. The third active element 57 is also connected to a capacitor $C_{51}$, which receives RF input, and an RF core circuit 500. The RF core circuit 500 is connected to a second voltage source 52 through an inductor $L_{51}$, as well as a capacitor $C_{52}$ for outputting an RF output.

Figure 6:
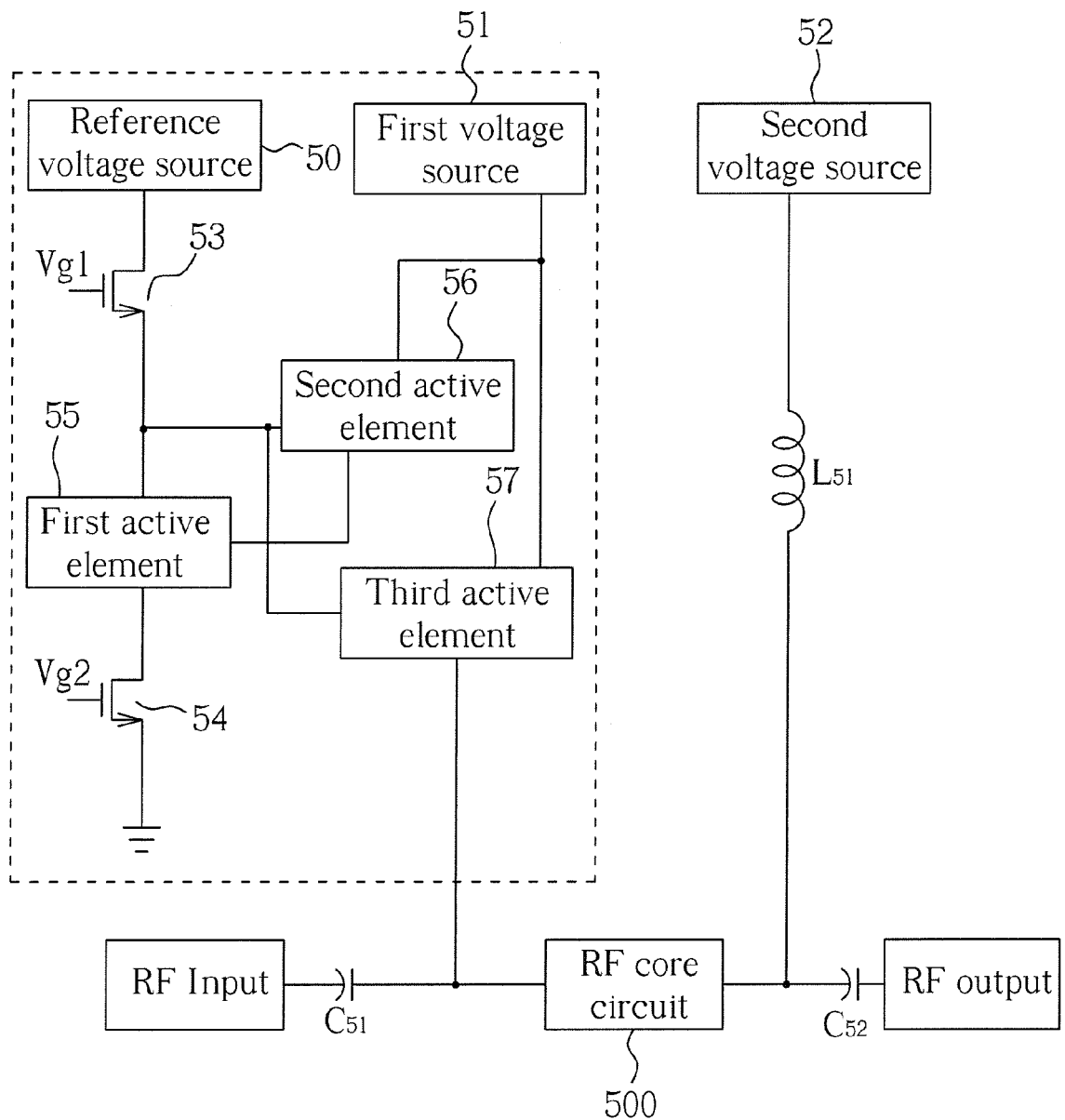
FIG. 6 to FIG. 11 are functional block diagrams showing linearized bias circuits with adaptation according to various embodiments of the present invention.

Reference is made to FIG. 6, which shows a functional block diagram showing a linearized bias circuit with adaptation according to another embodiment of the present invention. Differing from the embodiment shown in FIG. 5, FIG. 6 shows that the first passive element 53 and the second passive element 54 are MOS field effect transistors acting as passive elements.

Figure 7:
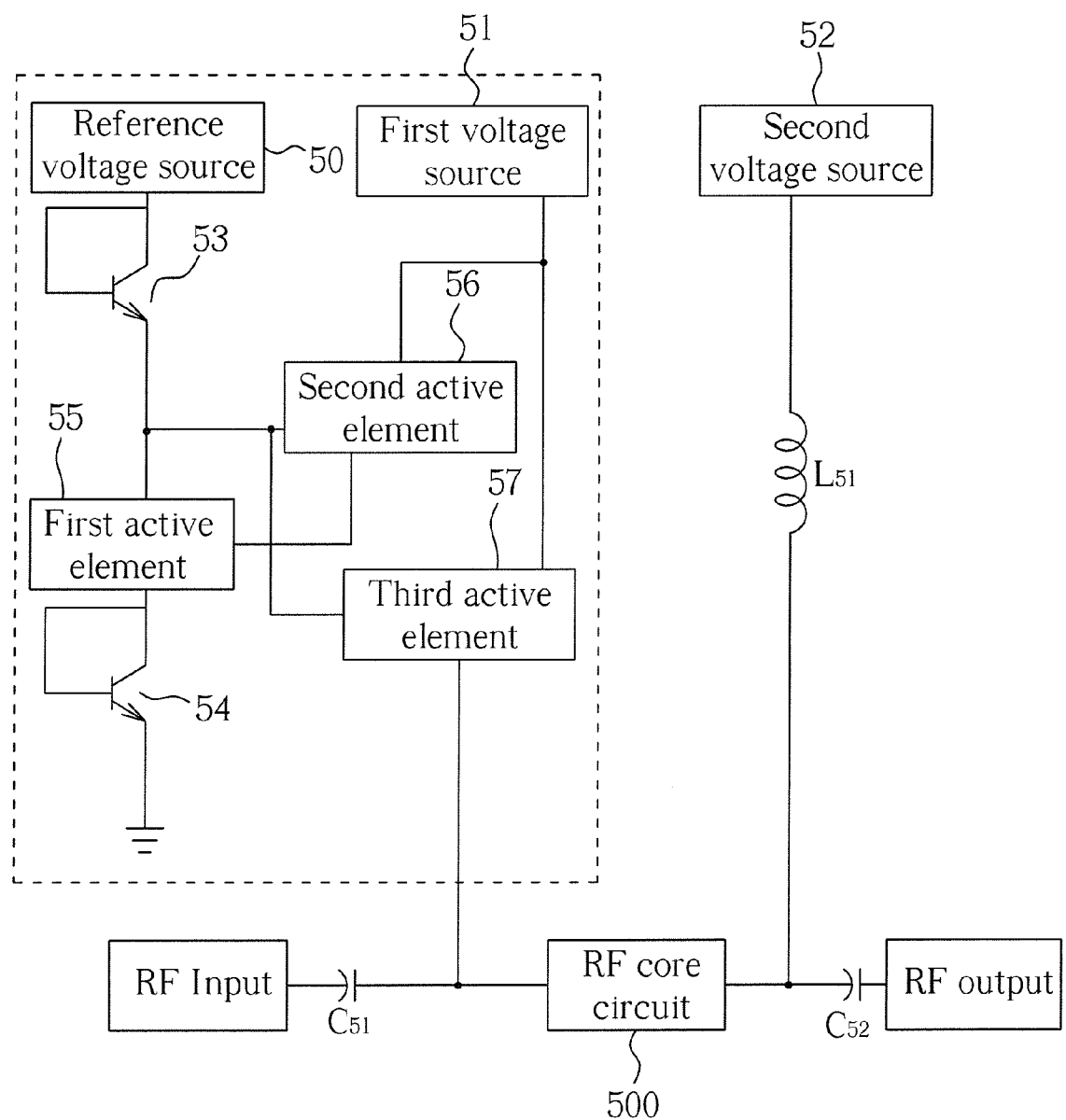

Reference is made to FIG. 7, which shows a functional block diagram showing a linearized bias circuit with adaptation according to another embodiment of the present invention. Differing from the embodiment shown in FIG. 5, FIG. 7 shows that the first passive element 53 and the second passive element 54 are NPN transistors acting as passive elements, each of which has its base connected to its collector.

Figure 8:
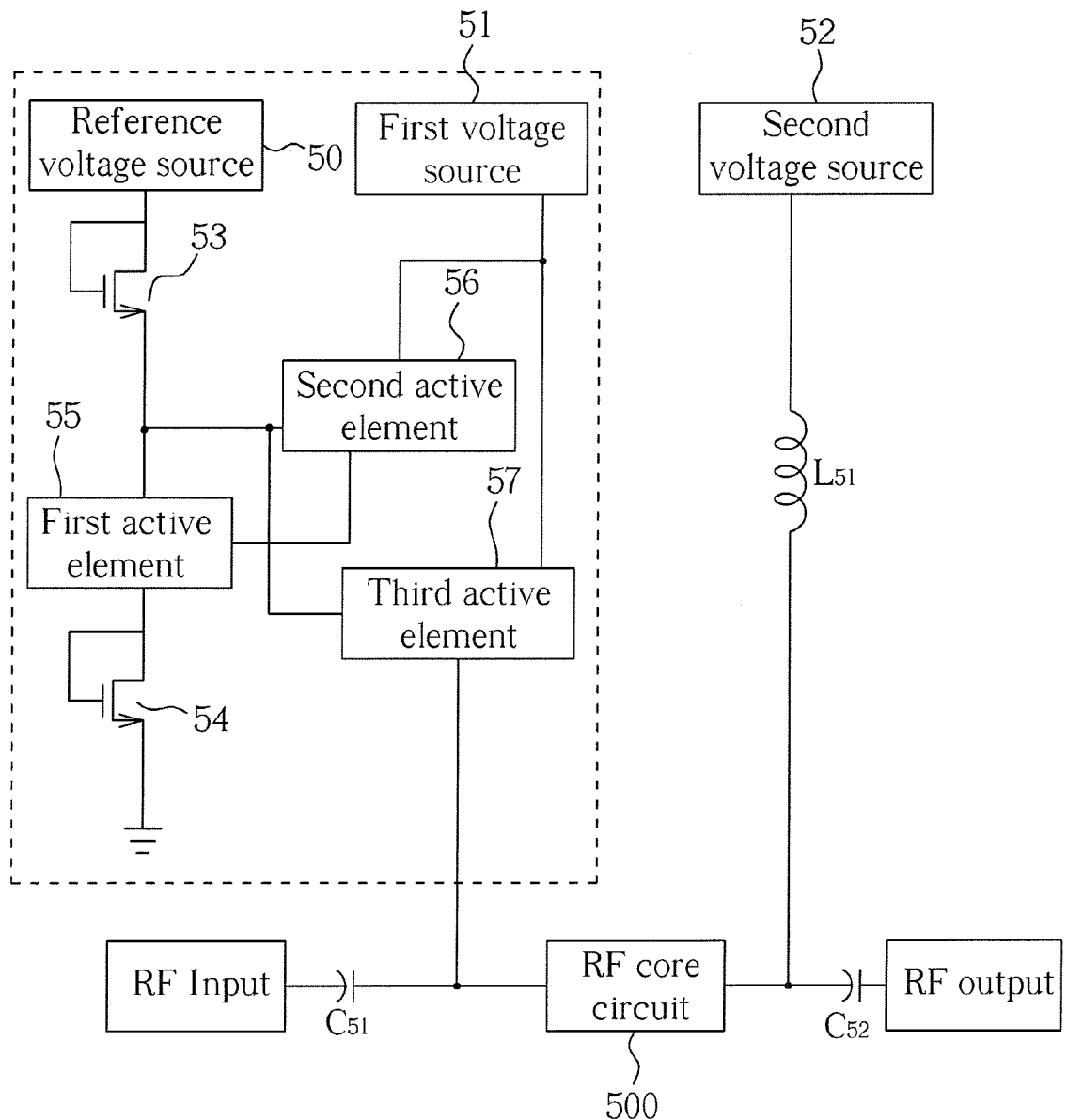

Reference is made to FIG. 8, which shows a functional block diagram showing a linearized bias circuit with adaptation according to another embodiment of the present invention. Differing from the embodiment shown in FIG. 5, FIG. 8 shows that the first passive element 53 and the second passive element 54 are MOS field effect transistors acting as passive elements, each of which has its gate connected to its drain.

Figure 9:
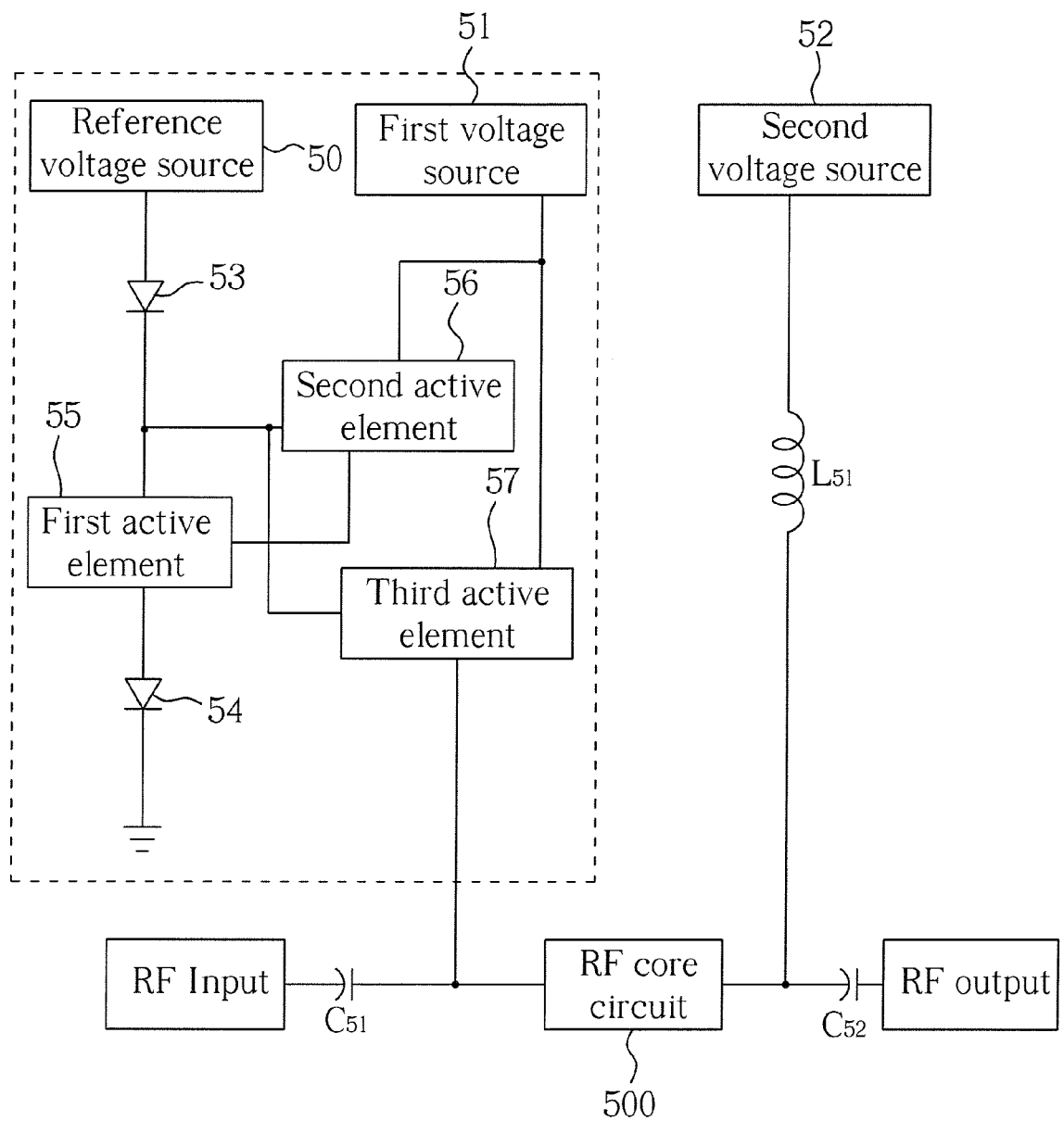

Reference is made to FIG. 9, which shows a functional block diagram showing a linearized bias circuit with adaptation according to another embodiment of the present invention. Differing from the embodiment shown in FIG. 5, FIG. 9 shows that the first passive element 53 and the second passive element 54 are diodes acting as passive elements.

Figure 10:
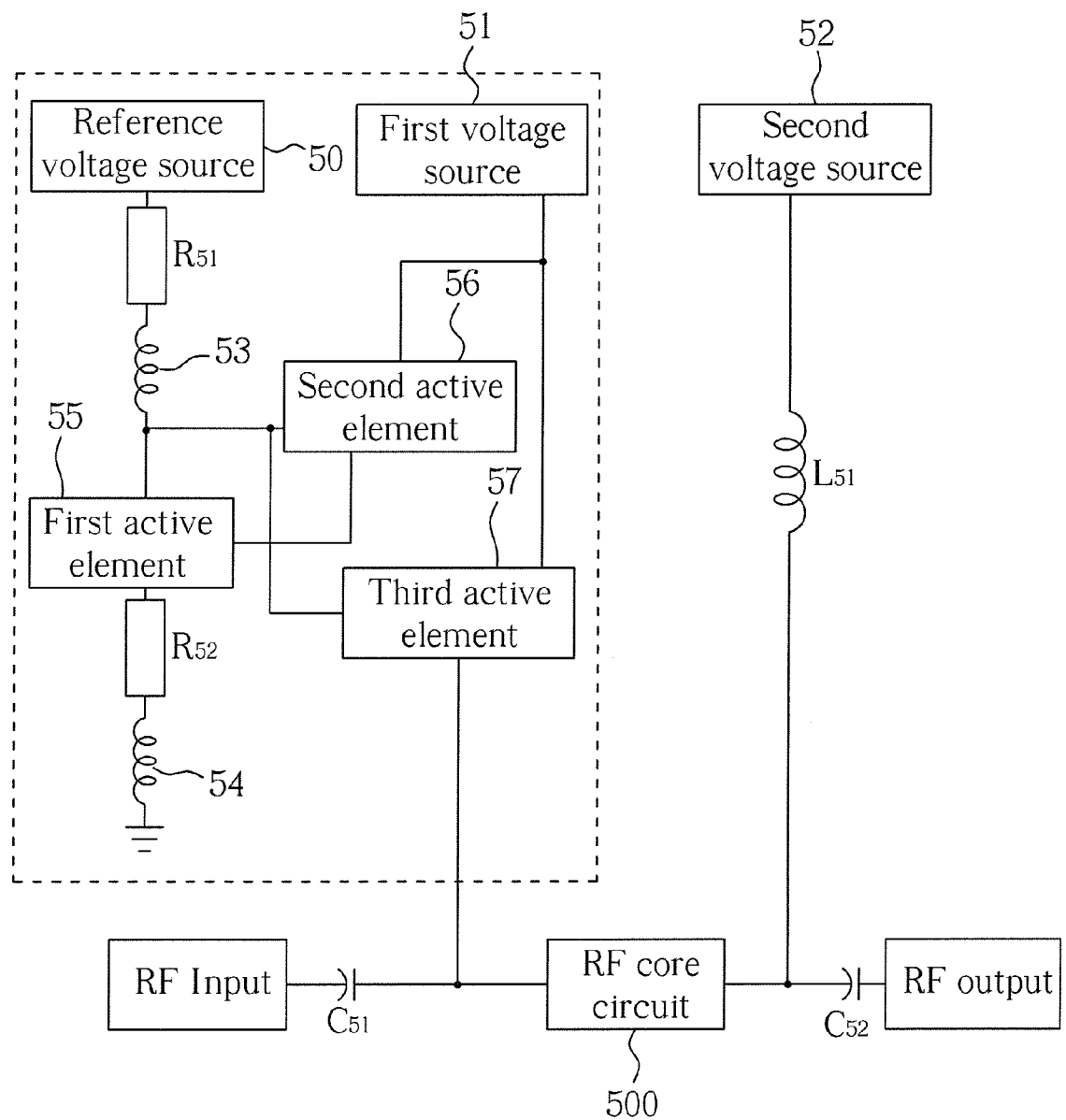

Reference is made to FIG. 10, which shows a functional block diagram showing a linearized bias circuit with adaptation according to another embodiment of the present invention. Differing from the embodiment shown in FIG. 5, FIG. 10 shows that the first passive element is made up of inductor 53 connected to resistor $R_{51}$ in series, and that the second passive element is made up of inductor 54 connected to resistor $R_{52}$ in series.

Figure 11:
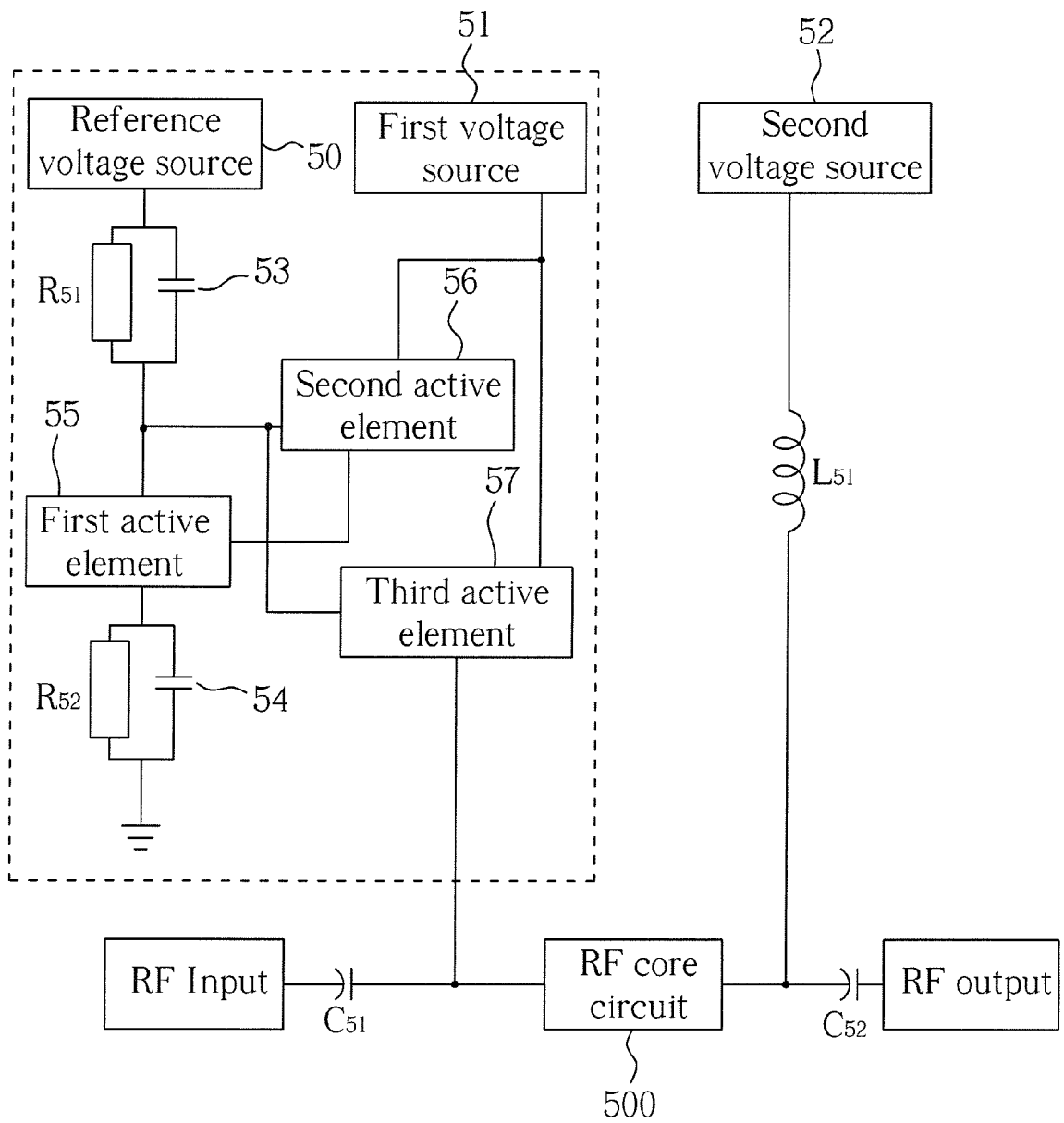

Reference is made to FIG. 11, which shows a functional block diagram showing a linearized bias circuit with adaptation according to another embodiment of the present invention. Differing from the embodiment shown in FIG. 5, FIG. 11 shows that the first passive element is made up of capacitor 53 connected to resistor $R_{51}$ in parallel, and that the second passive element is made up of capacitor 54 connected to resistor $R_{52}$ in parallel.

Consequently, the linearized bias circuit with adaptation according to the present invention is characterized in that:

1. The linearized bias circuit with adaptation utilizes bias current to execute a temperature compensation for the power amplifier so that a shift, even a deterioration, of the DC and AC characteristics of the power amplifier will not be produced due to the temperature variation.

2. The linearized bias circuit with adaptation provides a linearization technology for improving the linearity of the power amplifier.

3. Through using the linearized bias circuit with adaptation, the required bias current also can be reduced simultaneously so that the consumption of the DC current can be reduced.

4. The linearized bias circuit with adaptation can be easily integrated with other integrated circuit on a single chip.

5. The linearized bias circuit with adaptation has a simple architecture so that the quantity of required elements is small and the layout area is also small; the cost is thus simultaneously reduced.

All the active elements of the present invention can be BJT (Bipolar Junction Transistor), HBT (Heterojunction Bipolar Transistor), HEMT (High Electron Mobility Transistor), JFET (junction field effect transistor), MESFET (Metal Semiconductor Field Effect Transistor), or MOSFET (Metal Oxide Semiconductor Field Effect Transistor). All the passive elements of the present invention can be composed of transistors, diodes, resistors, inductive impedance elements, or capacitive impedance elements, and the linearized bias circuit with adaptation also can be used in an element having an effect similar to a low noise amplifier or mixer.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A linearized bias circuit with adaptation, comprising:
   a first passive element electrically connected to positive terminal of a reference voltage source;
   a first active element electrically connected to the first passive element;
   a second active element electrically connected to positive terminal of a first voltage source, the first passive element and the first active element;
   a third active element electrically connected to positive terminal of the first voltage source, the second active element, and an RF core circuit for providing bias current to the RF core circuit; and
   a second passive element electrically connected to emitter terminal or source terminal of the first active element at one end of the second passive element and electrically connected to ground at another end of the passive element;
   wherein the second passive element with first and second active element executes a temperature compensate by providing bias current of the RF core circuit.

2. The circuit according to claim 1, wherein the first active element, the second active element, and the third active element are BJT (Bipolar Junction Transistor), HBT (Heterojunction Bipolar Transistor), HEMT (High Electron Mobility Transistor), JFET (junction field effect transistor), MESFET (Metal Semiconductor Field Effect Transistor), or MOSFET (Metal Oxide Semiconductor Field Effect Transistor) elements.

3. The circuit according to claim 1, wherein the first passive element and the second passive element are transistors having conformable sizes, categories, scales, or types.

4. The circuit according to claim 1, wherein the first passive element and the second passive element are diodes having conformable sizes, categories, scales or types.

5. The circuit according to claim 1, wherein the first passive element and the second passive element are resistors having conformable sizes, categories, scales or types.

6. The circuit according to claim 1, wherein the first passive element and the second passive element are inductive impedances having conformable sizes, categories, scales, or types.

7. The circuit according to claim 1, wherein the first passive element and the second passive element are capacitive impedances having conformable sizes, categories, scales or types.

8. The circuit according to claim 1, wherein the RF core circuit is an element having an effect similar to a power amplifier, a low noise amplifier, or a mixer.

9. A linearized bias circuit with adaptation, comprising:
a first resistor electrically connected to positive terminal of a reference voltage source;
a first transistor electrically connected to the first resistor though a collector terminal thereof;
a second transistor electrically connected to positive terminal of a first voltage source though a collector terminal thereof electrically connected to the collector terminal of the first transistor through base tenninal thereof, and electrically connected to base terminal of the first transistor through emitter terminal thereof;
a third transistor electrically connected to positive terminal of the first voltage source through collector terminal thereof, electrically connected to base terminal of the second transistor through base terminal thereof and electrically connected to a power amplifier through emitter terminal thereof, and providing bias current to the power amplifier; and
a second resistor electrically connected to emitter terminal of the first transistor through one end thereof and electrically connected to ground through another end thereof;
wherein the second passive element with first and second active element executes a temperature compensate by providing bias current of the RF core circuit.

10. The circuit according to claim 9, wherein the first, the second and the third transistors are NPN transistors or PNP transistors.

11. The circuit according to claim 9, wherein the power amplifier can be replaced by an element having an effect similar to a low noise amplifier or a mixer.

12. A linearized bias circuit with adaptation, comprising:
a first resistor electrically connected to positive terminal of a reference voltage source;
a first field effect transistor electrically connected to the first resistor through drain terminal thereof;
a second field effect transistor electrically connected to positive terminal of a first voltage source through a drain terminal thereof, electrically connected to the drain of the first field effect transistor through gate terminal thereof, and electrically connected to gate terminal of the first field effect transistor through a source terminal thereof;
a third field effect transistor electrically connected to positive terminal of the first voltage source through drain terminal thereof, electrically connected to gate terminal of the second field effect transistor through gate terminal thereof, electrically connected to a power amplifier through source terminal thereof, and providing bias current to the power amplifier; and
a second resistor electrically connected to the source terminal of the first field effect transistor through one end thereof and electrically connected to ground through another end thereof;
wherein the second passive element with first and second active element executes a temperature compensate by providing bias current of the RF core circuit.

13. The circuit according to claim 12, wherein the first, the second and the third field effect transistors are JFET (junction field effect transistor), MESFET (Metal Semiconductor Field Effect Transistor), or MOSFET (Metal Oxide Semiconductor Field Effect Transistor).

14. The circuit according to claim 12, wherein the power amplifier can be replaced by an element having an effect similar to a low noise amplifier or a mixer.

* * * * *